(12) United States Patent
Turton

(10) Patent No.: US 6,597,255 B1
(45) Date of Patent: Jul. 22, 2003

(54) POWER TRANSMISSION SYSTEM FOR A FARADAY CAGE POWER SOURCE

(75) Inventor: Brian C Turton, Penarth (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/870,104

(22) Filed: May 30, 2001

(51) Int. Cl.$^7$ ................................................ H05K 9/00
(52) U.S. Cl. ........................................ 333/12; 310/113
(58) Field of Search ............................ 333/12; 310/113, 310/103; 464/20

(56) References Cited

U.S. PATENT DOCUMENTS 4,749,895 A  * 6/1988 Ruelle ........................ 310/113
5,982,253 A  * 11/1999 Perrin et al. ................. 333/182

* cited by examiner

Primary Examiner—Justin P. Bettendorf
(74) Attorney, Agent, or Firm—Barnes & Thornburg

(57) ABSTRACT

A transmission system is provided for a power source to transfer power to equipment housed within a Faraday cage. The transmission system transfers energy along a non-conductive path yet remains in conductive contact with the Faraday cage. This prevents EMI disturbing electrical power provided within the Faraday cage and damaging equipment housed within the cage. The transmission system enables mains power to be transmitted to equipment housed within the Faraday cage without the need to provide conventional electric filters. The performance of the Faraday cage in shielding electromagnetic radiation is not compromised. Nor is the ability of the Faraday cage to shield electromagnetic radiation generated by communications equipment within the cage compromised.

18 Claims, 10 Drawing Sheets

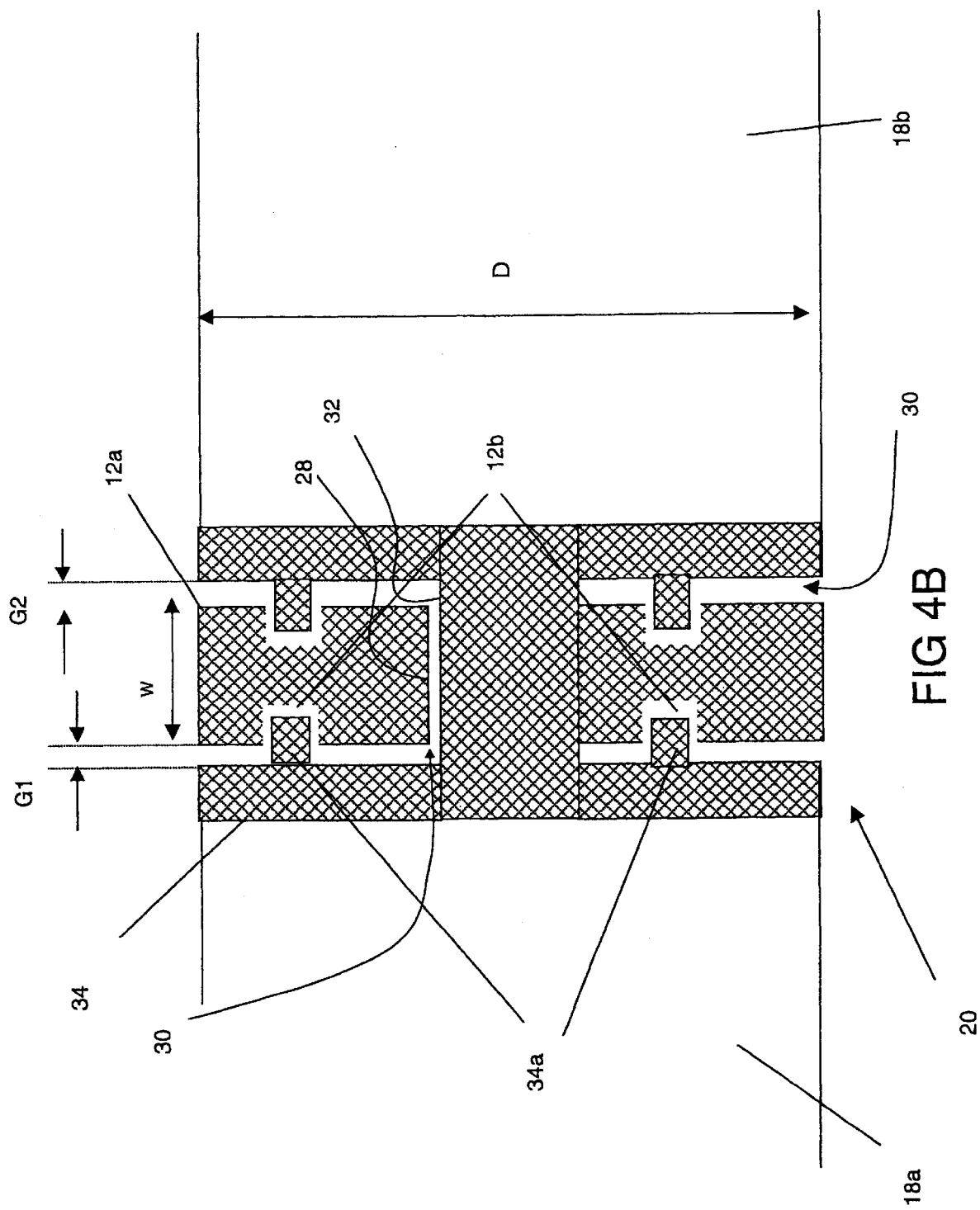

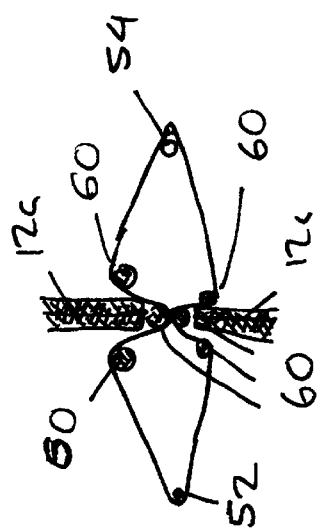
FIG 8C
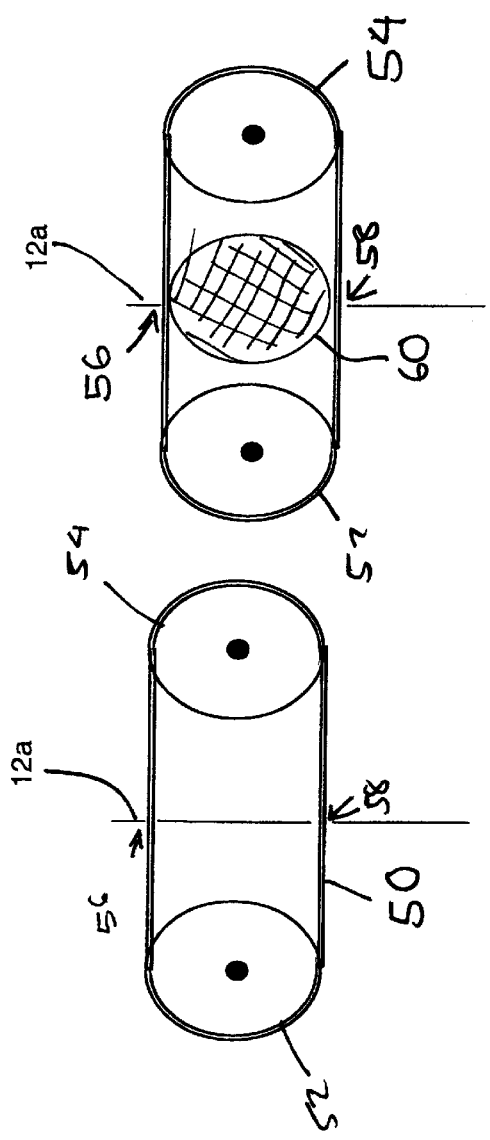
FIG 8B
FIG 8A

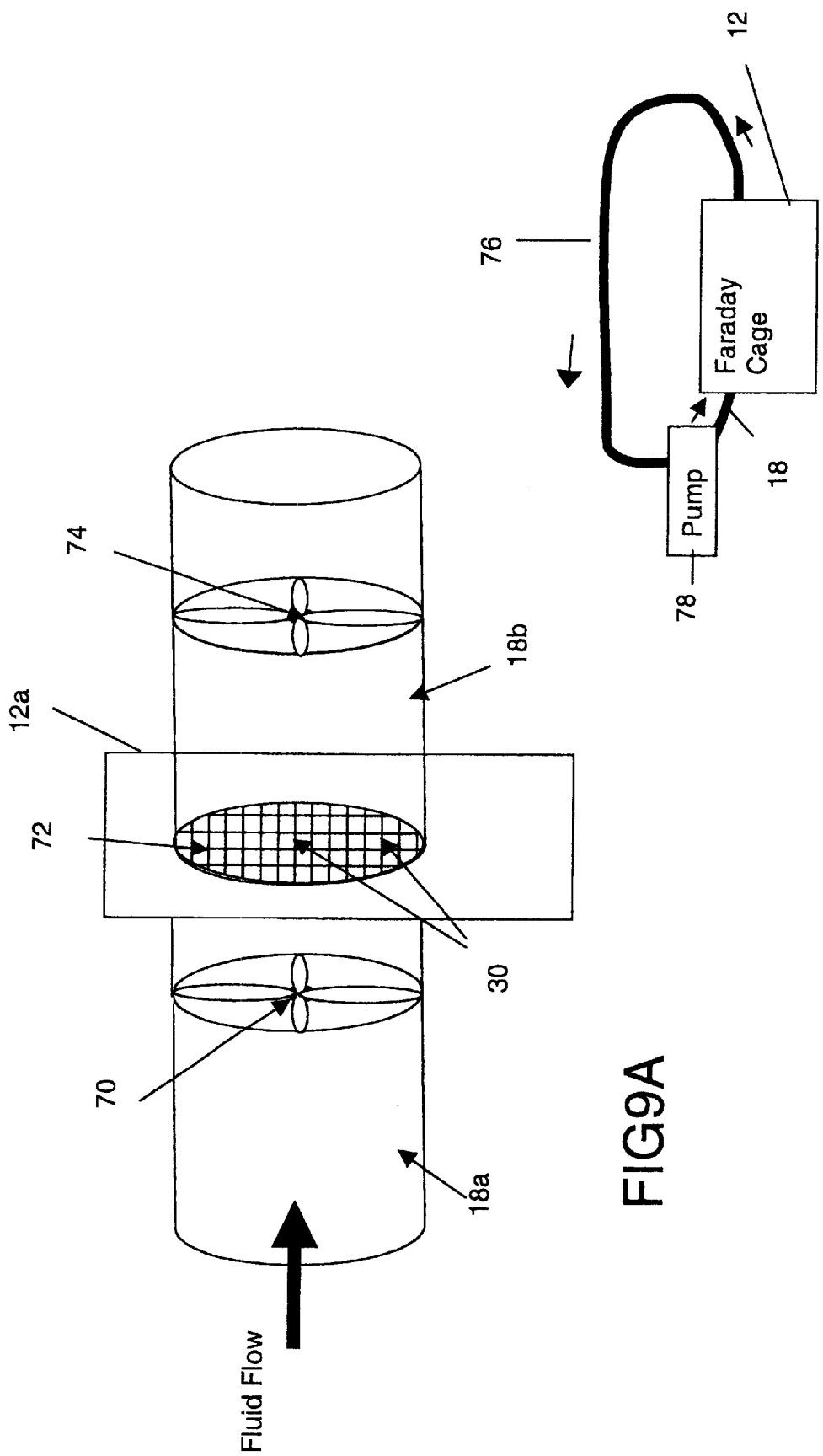

POWER TRANSMISSION SYSTEM FOR A FARADAY CAGE POWER SOURCE

FIELD OF THE INVENTION

The present Invention relates to a transmission system for providing power to equipment housed in a Faraday cage, to a power source for such equipment, and to a Faraday cage provided with such a power source. Particularly, but not exclusively, the transmission system enables power to be provided to communications equipment housed in a Faraday cage which requires shielding against electromagnetic interference and leakage up to at least 5 GHz.

BACKGROUND TO THE INVENTION

Equipment which is sensitive to electromagnetic interference is often protected by isolating apparatus within a conductive shell, or Faraday cage. Faraday cages are also used to retain electromagnetic radiation which is emitted by equipment. Electromagnetic field theory describes how electromagnetic waves interact with a conductive surface shell. Essentially, the shell distributes the electrical field around the shell surface, but not through the shell surface. Accordingly, electromagnetic fields generated outside a Faraday cage cannot penetrate within the cage, and internally generated fields cannot escape outside a Faraday cage.

Any nonconductive medium in the surface of the conductive shell provides an effective "hole" through which electromagnetic waves can escape, FIGS. 1A and 1B of the accompanying drawings Illustrate this effect at a basic level. In FIG. 1A, a positive point charge 10a is shown outside a conductive "box", Faraday cage 12. Field lines 14a are not able to intrude substantially through gap 16 in the Faraday cage 12. Similarly, as FIG. 1B shows, field line 14b from an internal point charge 10b cannot extrude substantially into the exterior of the Faraday cage 12 through gap 14.

Reducing the size of the gap 16, reduces the amount of external/internal field which is able to gain access to the interior/exterior of the Faraday cage 12. Accordingly, in practice, providing a gap in a Faraday cage is less than a wavelength across, the amount of electromagnetic radiation which is able to compromise the shielding provided by the cage is small.

Faraday cages can thus have a mesh-type structure, or be perforated for cabling access etc., and still function effectively as a shield against most electromagnetic radiation. The Faraday cage will not providing any shielding, however against radiation which has a substantially shorter wavelength than any gaps or other irregularities in the cage surface structure. This provides a limit on the size of any noninductive feature on the Faraday cage surface, whether an air-gap or another type of irregularity.

Commercially, it is advantageous if communications equipment can be isolated from electrical or electromagnetic interference (EMI). EMI can be defined as undesired conducted or radiated electrical disturbances, such as other electronic equipment might generate including transients, which can interfere with the operation of electrical or electronic equipment such as electrical power supplies. EMI disturbances can occur anywhere in the electromagnetic spectrum. However, radio frequency interference (RFI), usually defined as between 24 kilohertz (kHz) and 240 Gigahertz (GHz), is often considered to be synonymous with EMI for practical purposes. For communications purposes, however, providing protection against electromagnetic pulses up to 5 GHz is usually considered sufficient.

EMI/RFI can be generated by a range of phenomena, and include potentially destructive electromagnetic phenomena, both natural and man-made. Lightning and other types of electromagnetic pulses can create very destructive EMI as the pulse fields couple to electrical radiation and generate electrical transients in power and communications systems. For example, some electromagnetic fields can generate very short high energy transients in electrical connections and cables or longer transients which have lower voltage disturbances. For example, core current transients up to around 150 Amp having full width half maximum FWHMs of 1.2 to 1.4 s, and core voltage transients of up to around 7 kV (FWHM 2.1 s to 4 s) can be induced which are known to cause damage. Similarly, transients which have lower core currents (<40 Amp) can be induced which can last for much longer (FWHM 38 to 40 s), and can accompany voltage pulses as high as 9.4 kV, which last for over a minute and so are potentially very destructive. Such transients can generate energy dumps sufficiently large to melt electrical connections and cables.

It is particularly highly desirable to shield communications equipment from such EMI/RFI due to the fact that communications equipment, even if predominantly provided by optical components, often includes electronic components such as integrated circuit (IC) chips, IC packages, and multi-chip modules along with hybrid components.

One solution to the problem of providing protection against such EMI is to filter out the disturbance at the equipment level, as shown in U.S. Pat. No. 6,034,855. However such filters can be relatively costly and expensive to maintain. Another solution is to house equipment in Faraday cage structures which act as shields against EMI.

Faraday cages can have a variety of forms and can be constructed on a variety of scales. At the circuit board level, a conductive shield can be provided by a "can" covering components and electrically grounded to a substrate such as a printed wiring board. At a larger scale, entire racks of equipment may be housed in conductive cabinets which are grounded to shield their contents from external sources of EMI. Other examples of the forms of Faraday cages include conductive housings, temporary large scale structures effectively providing a "conductive tent", a metallic or metalised box or case. The cage surface may be smooth or may be perforated in such a way as to minimise the radiation which is able to penetrate the interior of the cage at any given frequency.

In the field of fibreoptic communications, transmission equipment is often shielded by installing the equipment in a conductive housing. The conductive housing functions effectively as a Faraday cage. Cabling conduits for the housing must be sized appropriately according to the desired cut-off frequency for the Faraday cage, i.e., the conductive surface must not be interrupted for more than a fraction of the maximum wavelength the housed equipment can tolerate. For the purposes of most communications equipment, a hole of around one tenth of the cut-off wavelength is possible without unduly compromising the efficiency of the cage.

However, a problem exists in that power must still be provided to the interior of the cage. Batteries and generators may be provided within some Faraday cages as isolated sources of power, however, these are costly to run and maintain and can take up the space within the Faraday cage. However, in the case where a cage needs to be completely sealed, an isolated power source is required.

In the case where a Faraday cage can be perforated, a direct connection with an external power supply is usually not suitable unless a low-pass filter is provided. Such a filter needs to be able to remove any undesirable power characteristics in the external supply, and has to be able to cope with a range of EMI disturbances. It is essential that such filters are capable of removing electromagnetic power surges, pulses, or spikes, whether created by human endeavour or by natural means such as lightening, electrical storms, etc., within the design tolerance required for the Faraday caged equipment. Accordingly, such filters are often a costly solution to the problem of providing power to equipment housed in a Faraday cage. Other problems include the space required by such filters and the inherent uncertainty in their performance providing protection against higher energy transients.

OBJECTS OF THE INVENTION

The invention seeks to provide a transmission system for power to equipment housed within a Faraday cage. The system transfers power from an external power source to an internal power generator and yet does not mitigate the shielding provided by the Faraday cage against EMI disturbances.

SUMMARY OF THE INVENTION

A first aspect of the invention seeks to provide a transmission system for providing power to equipment housed within a Faraday cage, the transmission system comprising: a transmission element adapted to transfer energy from a first power source located outside the Faraday cage to a second power source located within the Faraday cage, the transmission element including a conductive region arranged to form conductive contact with said Faraday cage; the second power source for providing said equipment with power, wherein energy is transferred into the Faraday cage along a non-conductive path Preferably, said transmission element includes a conductive region for forming conductive contact with said Faraday cage.

Advantageously, by providing conductive contact between said transmission element and said Faraday cage, the shielding providing by the Faraday cage is not unduly compromised. A sufficiently good contact, for example, enables the Faraday cage to provide a very good level of shielding.

Preferably, said conductive contact is formed by at least one friction-reducing element provided between the transmission element and a boundary of the Faraday, said at least one friction-reducing element taken from the group consisting of a conductive lubricant, a conductive ball-bearing, graphite, and mercury.

Preferably, said transmission element transfers energy in a form taken from the group consisting of: mechanical energy, rotational energy, hydraulic energy, magnetic energy.

Preferably, said transmission element drives said second power source using said first power source, and said transmission element is taken from the group consisting of: a drive belt; a drive shaft; a fluid; a hydraulic piston; a resilient member; a spring.

Preferably, said transmission element passes through an aperture in said Faraday cage.

Preferably, said transmission system and said Faraday wall are configured to engage each other.

A second aspect of the invention seeks to provide a power source for equipment housed in a Faraday cage, the power source including: a first power source located outside the Faraday cage; a second power source located within the Faraday cage for providing power to said equipment; and a transmission system comprising a transmission element adapted to transfer energy from a first power source located outside the Faraday cage to a second power source located within the Faraday cage, the transmission element including a conductive region arranged to form conductive contact with said Faraday cage; the second power source being providing said equipment with power, wherein energy is transferred into the Faraday cage along a non-conductive path.

Preferably, the power source further includes a low-pass filter.

Preferably, said low-pass filter filters out power disturbances provided to said first power source. Advantageously, this prevents the first power source from being affected by power surges or suffering damage due to high energy EMI pulses coupling to the power source of said first power source.

Preferably, said second power source provides electrical power.

Preferably, said second power source comprises an electrical generator which is driven by the energy transferred by said transmission system.

The first power source may be powered by electrical power. The first power source may be an electric motor.

A third aspect of the invention seeks to provide a Faraday cage for housing equipment and shielding electromagnetic radiation, the Faraday cage having a power source including:

a first power source located outside the Faraday cage;

a second power source located within the Faraday cage for providing power to said equipment; and a transmission system comprising a transmission element adapted to transfer energy from a first power source located outside the Faraday cage to a second power source located within the Faraday cage, the transmission element including a conductive region arranged to form conductive contact with said Faraday cage; the second power source being for providing said equipment with power, wherein energy is transferred into the Faraday cage along a non-conductive path.

Preferably, said power source provides electrical power to said equipment, said Faraday cage provides optical means for the ingress to and egress from data from said equipment and said equipment is take from the group including: communications equipment, computer equipment, medical equipment.

A waveguide may be attached to said Faraday cage in the vicinity of an aperture through which said transmission element passes, said wave-guide being adapted to prevent further propagation of electromagnetic radiation of a predetermined wavelength away from said aperture in said Faraday cage.

Preferably, said Faraday cage provides shielding against EMI disturbance.

The fourth aspect of the invention seeks to provide a communications network including at least one Faraday cage for housing communications equipment and shielding electromagnetic radiation, the Faraday cage provided with a power source located within the Faraday cage for providing power to said communications equipment; and a transmission system comprising a transmission element adapted to transfer energy from a first power source located outside the Faraday cage to a second power source located within the Faraday cage, the transmission element including a conductive region arranged to form conductive contact with said Faraday cage; the second power source being for providing said communications equipment with power, wherein energy is transferred into the Faraday cage along a non-conductive path.

The Faraday cage is able to provide shielding against electromagnetic radiation over a range of frequencies at which EMI disturbance can affect communications equipment, for example, electromagnetic radiation up to at least 800 MHz, but more preferably up to at least 5 GHz, and even as high as 240 GHz.

Advantageously, such a Faraday cage prevents electromagnetic transmissions emanating from within the cage from being detected externally which, for example, might provide information on the content of such transmissions and the location of the equipment.

Advantageously, the isolation of the power supply therefore enables Faraday cages to be constructed which are particularly suited to environments where confidential information is being transmitted. It is possible to elicit information from electromagnetic emissions, and by enabling the construction of Faraday cages which provide a high shielding level against electromagnetic radiation associated with the transmission of information, protection against detection can be provided for such confidential information.

Advantageously, the power supply can be provided to equipment which is relatively compact in dimensions by suitable modification in size and or the driving mechanisms for the drive shaft. Accordingly, the power supply can be made portable or manually operated. The power supply is thus suitable for deployment in a moveable (e.g. a portable Faraday cage) or a static environment.

The invention is also directed to a method of transferring power from an external power source to an internal power source by which the described apparatus operates and including method steps for carrying out every function of the apparatus.

The preferred features may be combined as appropriate, as would be apparent to a skilled person, and may be combined with any of the aspects of the invention.

BRIEF DESCRIPTION OF THE DRAWING

In order to show how the invention may be carried into effect, embodiments of the invention are now described below by way of example only and with reference to the accompanying figures in which:

FIGS. 4A and 4B show enlargements of the transmission systems of the second and third embodiments of the invention;

FIGS. 8A, 8B and 8C shows a seventh embodiment of the invention, and variations on said embodiment; and FIGS. 9A and 9B show views of an eighth embodiment of the invention.

DETAILED DESCRIPTION OF INVENTION

Any range or device value given herein may be extended or altered without losing the effect sought, as will be apparent to the skilled person for an understanding of the teachings herein.

Figure 1A:
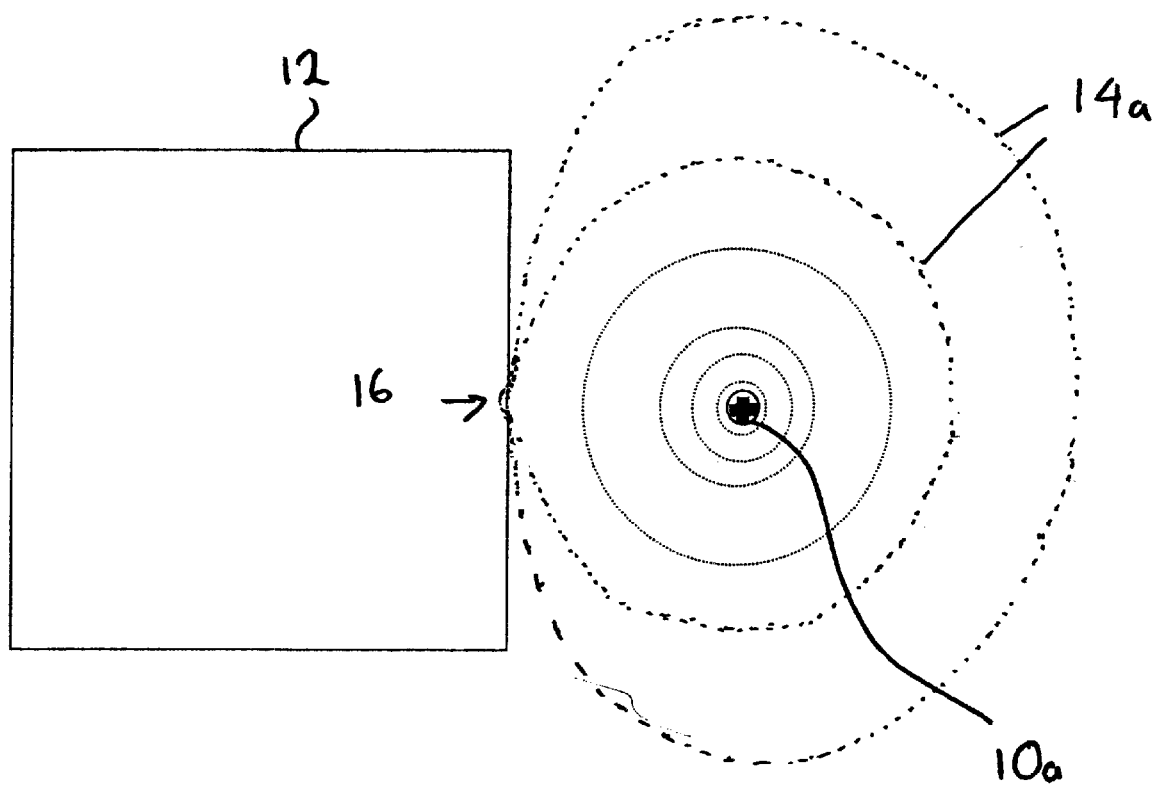
FIGS. 1A and 1B sketch of a basic Faraday cage and show how fields generated by external and internal electric charges respectively are unable to penetrate through a gap in the cage structure.
Figure 1B:
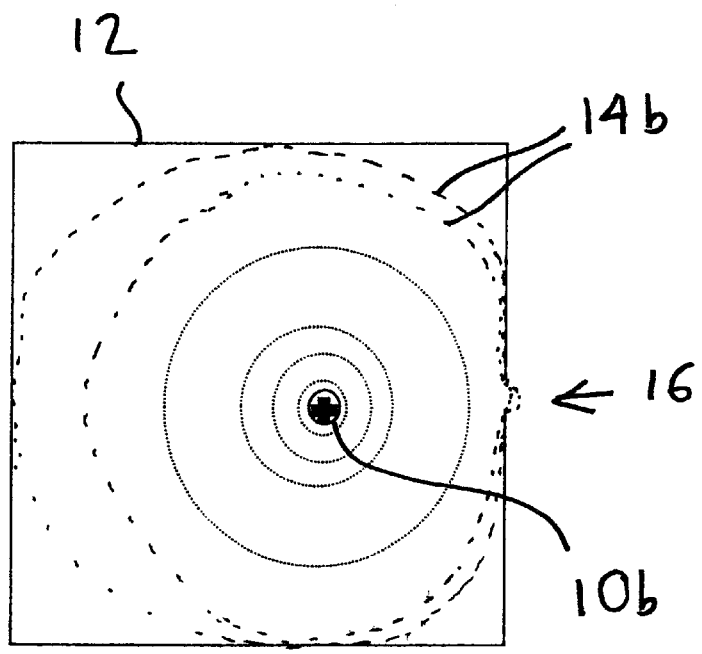
Figure 2:
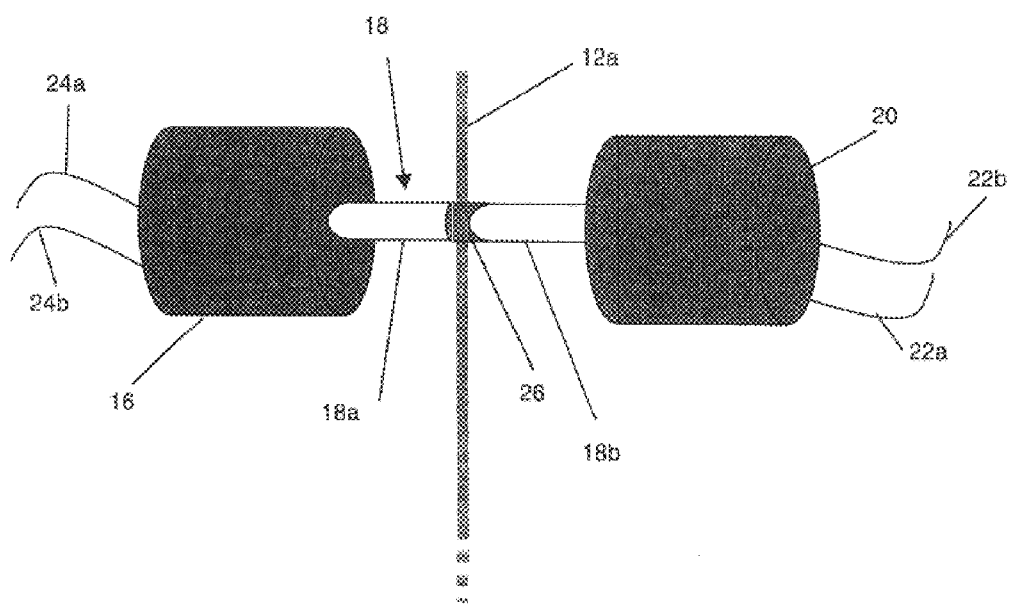
FIG. 2 shows a sketch of a transmission system according to the invention.

FIG. 2 of the accompanying drawings illustrates a transmission system according to a first embodiment of the invention. In FIG. 2, the transmission system transfers power via a transmission element 18 from a first power source 16 located outside Faraday cage 12 through an aperture in a wall 12a of the Faraday cage to drive a second power source 20. Second power source 20 provides power to equipment (not shown) housed within the Faraday cage 12.

The transmission element 18 transfers energy without using a conductive electrical path by providing energy in a mechanical form through the wall 12a to the second power source 20. The second power source 20 converts the mechanical energy it receives from the transmission element 18 into a form suitable for powering the equipment housed within the Faraday cage 12. For example, second power source 20 may comprise an electrical generator and provide electrical power or may comprise a battery charger to power batteries which provide power to electrical equipment. Alternatively, the second power source may power a pump or turbine and use the energy it receives to drive such equipment directly.

The external power source 16 shown in FIG. 2 comprises a motor. The motor 16 rotates the transmission element 18, for example a drive shaft as shown in FIG. 2, to transfer rotational energy to within the Faraday cage 12 in a manner which does not compromise the shielding efficiency of the Faraday cage 12. As power passes through the Faraday cage in a form which is not susceptible to coupling with electromagnetic radiation, in the event EMI phenomena occurs outside the Faraday cage 12, equipment housed within the cage is not damaged.

The rotation of the transmission element 18 drives generator 20, thus the rotational energy transferred into the cage along the drive shaft is transformed into electrical energy. The electrical power provided by the generator 20 is provided to other equipment (not shown), for example, communications or medical equipment which is housed within the Faraday cage 12 via some suitable connections 22a, 22b.

The power source 16 located outside the Faraday cage 12 may be driven by an external electrical power source (not shown), for example, mains electricity or a generator/battery, or by other means, for example, by a gas turbine etc.

Figure 3:
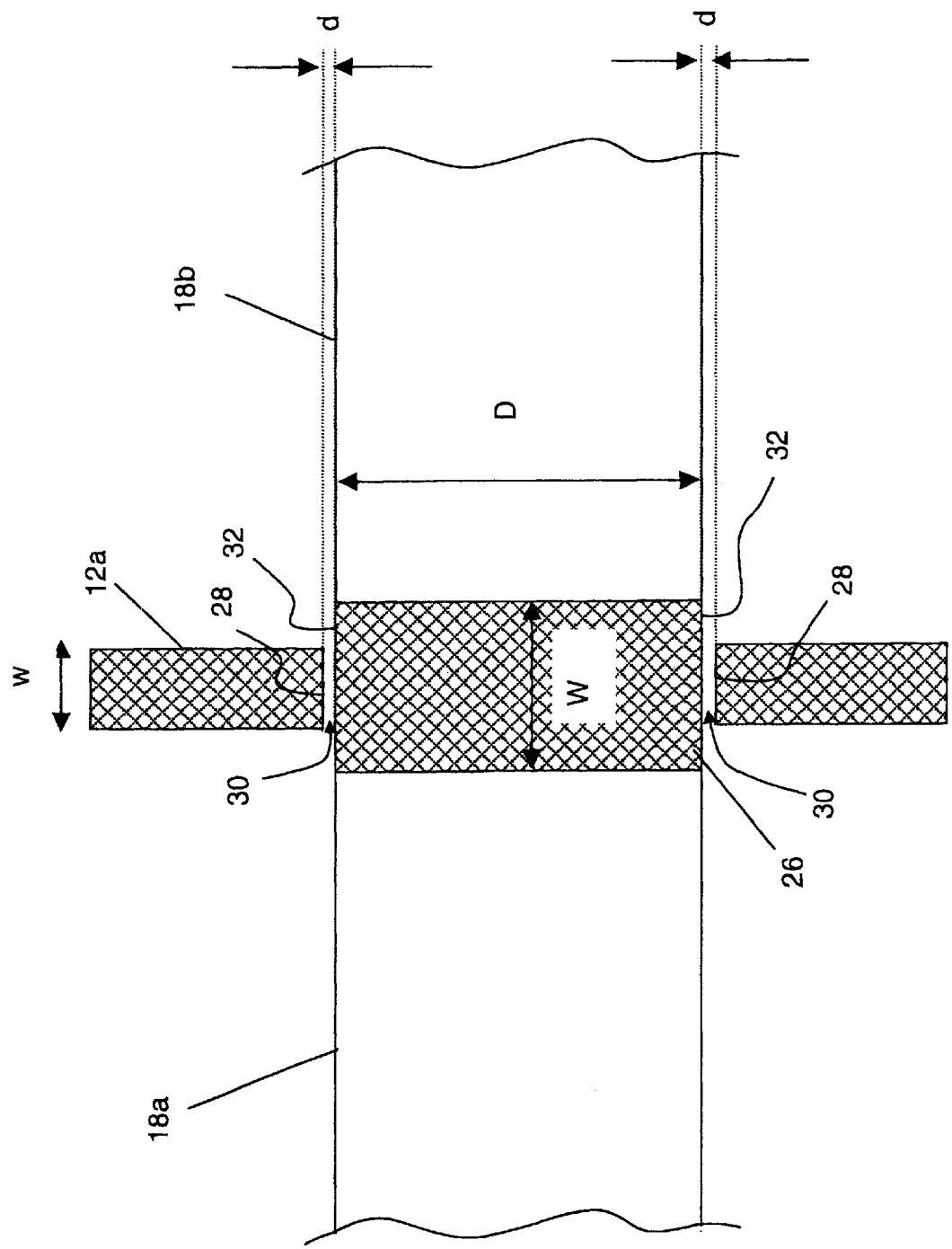
FIG. 3 is an enlargement of the transmission system shown in FIG. 2.

In the embodiment shown in FIG. 2, the transmission element 18 passes through an aperture in the wall 12a of the Faraday cage 12. The material and configuration of the transmission element 18 is constructed to minimise any penetration of electromagnetic phenomena through the cage 12. Accordingly, it is advantageous if energy is provided by the transmission element 18 along a path which is not electrically conductive, The size of any gap or aperture in the Faraday cage 12 must be kept as small as possible to provide shielding against very high frequency EMI. FIG. 3 shows in more detail the embodiment shown in FIG. 2, in which the transmission element 18 is provided with a conductive portion 20 which registers with the wall of the Faraday cage 12a. By ensuring that the aperture in the Faraday cage wall is substantially filled with a conductive material, the size of any non-conductive boundary region 30 (unhatched) through the Faraday cage wall 12a is minimized. The smaller the size of the boundary region 30, the better the EMI shielding provided by the Faraday cage 12 remains against high frequency radiation.

in FIG. 3, conductive regions are shown hatched. As FIG. 3 illustrates, the drive shaft 18 comprises a conductive portion 26 of width "W" which is isolated from the interior of the Faraday cage by insulating portion 18b of drive shaft 18, and which is isolated from the exterior motor by insulating portion 18a of drive shaft 18. In FIG. 3, the thickness of the conductive Faraday wall at this point is "w". The width of the conductive region W is preferably at least equal to that of the Faraday wall "w", i.e., preferably W≈w, to minimise diffraction effects.

As FIG. 3 shows, a boundary region 30 forms a gap of width "d" between the surface 32 of the transmission element 18 and the facing surface 28 of the wall 12a of the Faraday cage. The dimensions of the boundary region 30 are important as they affect the amount by which the transmission element 18 reduces the shielding provided by Faraday cage 12. For example, to ensure that shielding against EMI disturbances up to 5 GHz is provided, the gap width "d" should be less than λ/10=6 mm. In fact, for mechanical reasons, "d" is normally less than 1 mm. Ideally the "gap" is as small as is mechanically possible, e.g., <0.02 mm. Such a small "gap" ensures that shielding against radiation up to around 125 GHz is not compromised by the annular "gap" around the transmission element. Moreover, any residual "gap" can also be filled with a suitable conductive element, especially a conductive element which reduces friction between the surface boundary of the Faraday cage wall and the surface of the transmission element, to increase the cut off frequency, e.g. to as high as above 250 GHz. Suitably conductive, friction-reducing, elements include, for example, a suitable lubricant or combination of ball bearings and lubricant which provide conductive contact between the Faraday cage wall and the transmission element. This effectively removes any non-conductive boundary region 30 through which electromagnetic radiation might otherwise propagate.

Additional features which provide shielding against radiation up to an appropriate cut-off frequency can also be provided. Generally, however, providing the width of the gap "d" is sufficiently small, and in particular if the gap is filled by a suitably conductive element, the performance of the Faraday cage 12 will not be compromised by the provision of the transmission element 18 through the walls of the cage.

The width of the gap between the conductive portion 26 of drive shaft 18 and the edge of the Faraday cage wall 12a as FIG. 3 shows schematically is preferably less than 1 mm at this point. Higher frequency EMI disturbances can be shielded against by reducing the size of or removing gap "d" and by ensuring the diameter of the driveshaft D is minimised, or by modifying the design of the conductive portion and/or the Faraday cage.

To minimize the size of the aperture in the Faraday wall, which might otherwise compromise the shielding performance of the Faraday cage, the diameter of the aperture (as shown in FIG. 3, D+2d) is ideally small and the boundary region 30 is also small. For example, the diameter of the annular non-conductive region around the Faraday cage wall as shown in FIG. 2 is typically less than around 30 mm, and the width of gap "d" is typically significantly less than around 1 mm, for example 0.1 mm or less. In this manner, the Faraday cage is able to provide shielding against electromagnetic radiation up to ~800 MHz or higher, e.g. 1 GHz or 5 GHz, or even as high as 250 GHz.

Examples of modifications to the drive shaft 18 and the wall 12a of the Faraday cage which can provide enhanced shielding will now be described with reference to various alternative embodiments of the invention. It will be appreciated that the skilled man in the art will recognise that certain of these embodiments can be combined where appropriate to further improve the shielding against EMI disturbances.

As described briefly herein above, one way of ensuring a conductive connection between the transmission element and the Faraday cage wall is to remove any non-conductive portions in the boundary region 30. For example, whilst FIG. 3 effectively shows an air gap between the shaft surface 32 and the edge 28 of the Faraday cage 12, this gap can be filled by a suitably conductive fluid, for example, mercury, or conductive ball bearings can be used. It is preferable if a conductive fluid comprising a suitable lubricant is used as well so that a friction-reducing conductive element is provided in the boundary region 30. Such a conductive fluid could comprise metallic particles suspended in an oil-type liquid for example, or a graphite based lubricant could be used.

Figure 4A:
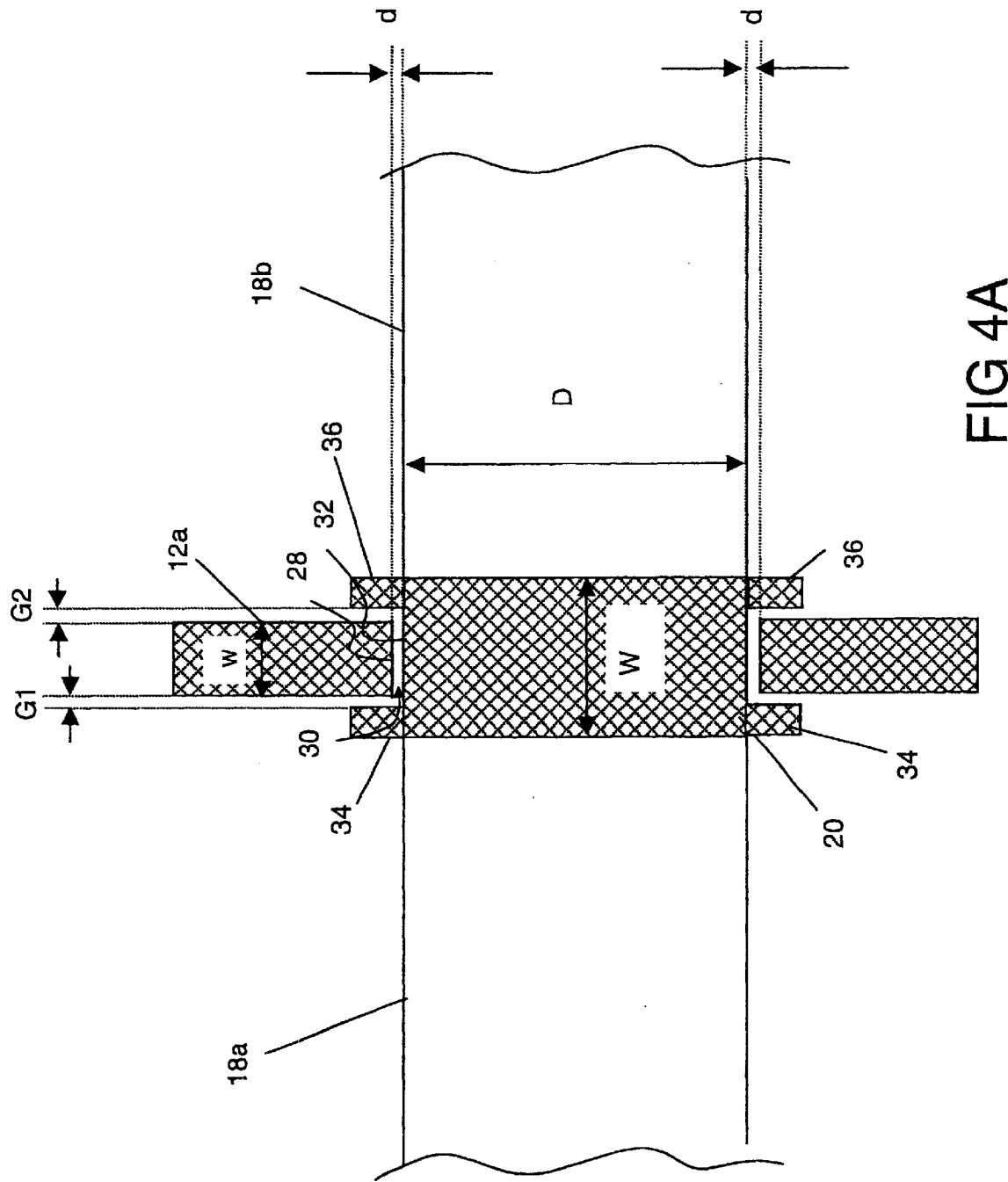
Figure 5:
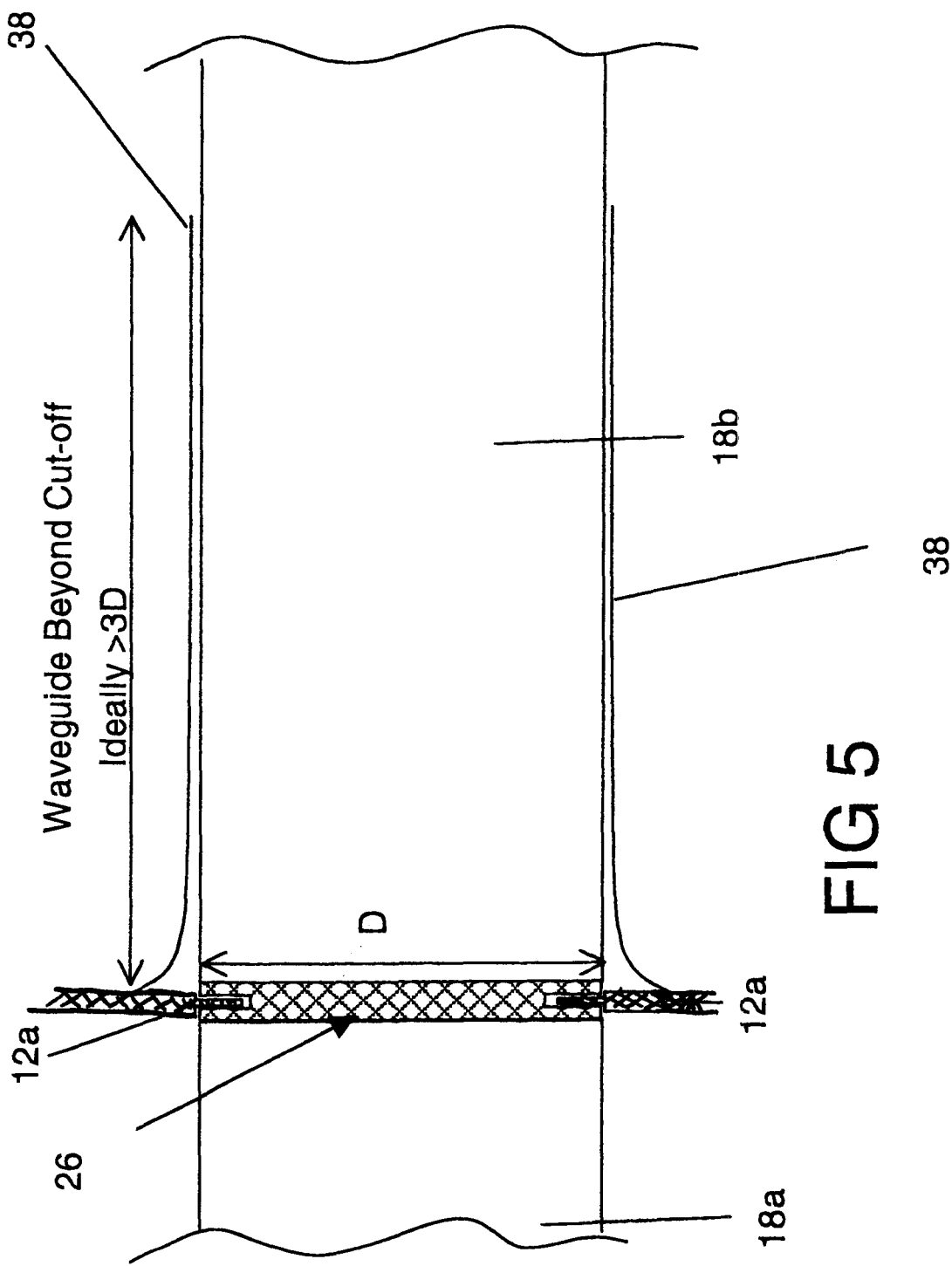
FIG. 5 shows an enlargement of a transmission system of a fourth embodiment of the invention.

FIG. 4A shows a second embodiment of the invention which modifies the shape of the boundary region 30 of the drive shaft shown in FIG. 3. Conductive annular flange sections 34, 36 are provided on the drive shaft 18 to overlap the edge of the aperture in the Faraday cage wall. This creates a boundary region 30 which has a U-bend type configuration. The drive shaft is thus able to engage with the edge 28 of the Faraday cage 12 and remove any line-of-sight aperture through the wall of the Faraday cage. In FIG. 4A, only a U-bend configuration is shown, but a series of U-bend type configurations or equivalently a tongue/groove type-configuration may be provided when this is feasible for a Faraday cage construction.

in the embodiment shown in FIG. 4A the annular flange sections 34, 36 provided on at each end of the conductive region 20 form exterior and interior rims around the wall of the Faraday cage. Alternatively, one or both flanges 34, 36 may be omitted and instead an annular groove may be formed in the conductive portion of the drive shaft 18 into which the Faraday wall can extend (such as FIG. 5 shows). Again, this removes any line-of-sight path for electromagnetic radiation through the boundary region 30.

As is apparent to one skilled in the art, the configuration of the draft shaft 18 and Faraday cage 12 need not be symmetrical about the cage surface, and the flange portions 34, 36 may be present only on one side of the cage wall, and/or may be provided with further engaging features such as FIG. 4B shows. In FIG. 4B, an example of a further modification to a flange and the Faraday cage wall 12a around the region of the drive shaft 18 is shown. In this third embodiment, annular protrusions 34a formed in annular flange 34 extend into an annular cavity 12b formed in the wall of the Faraday cage 12.

A fourth embodiment is shown in FIG. 5. In FIG. 5, the Faraday wall 12a extends into a groove in the conductive portion 26 of the transmission element drive shaft 18. A wave-guide 38 is attached to the interior side of the Faraday cage wall 12a. The wave-guide 38 prevents radiation with frequencies sufficiently high to otherwise pass into the interior of the Faraday cage 12 due to the size of the aperture itself in the Faraday cage wall, i.e., here effectively the width of the drive shaft 18 "D". By providing wave-guide 38 any radiation which does penetrate the Faraday cage due to the aperture size is not able to propagate too far inside the cage and potentially damage equipment.

Practical considerations make it desirable for wave-guide 38 to be approximately three times the width "W" of the drive shaft 18. A wave-guide may alternatively be provided on the external wall surface, for example, if conserving space within the Faraday cage 12 is important.

Figure 6:
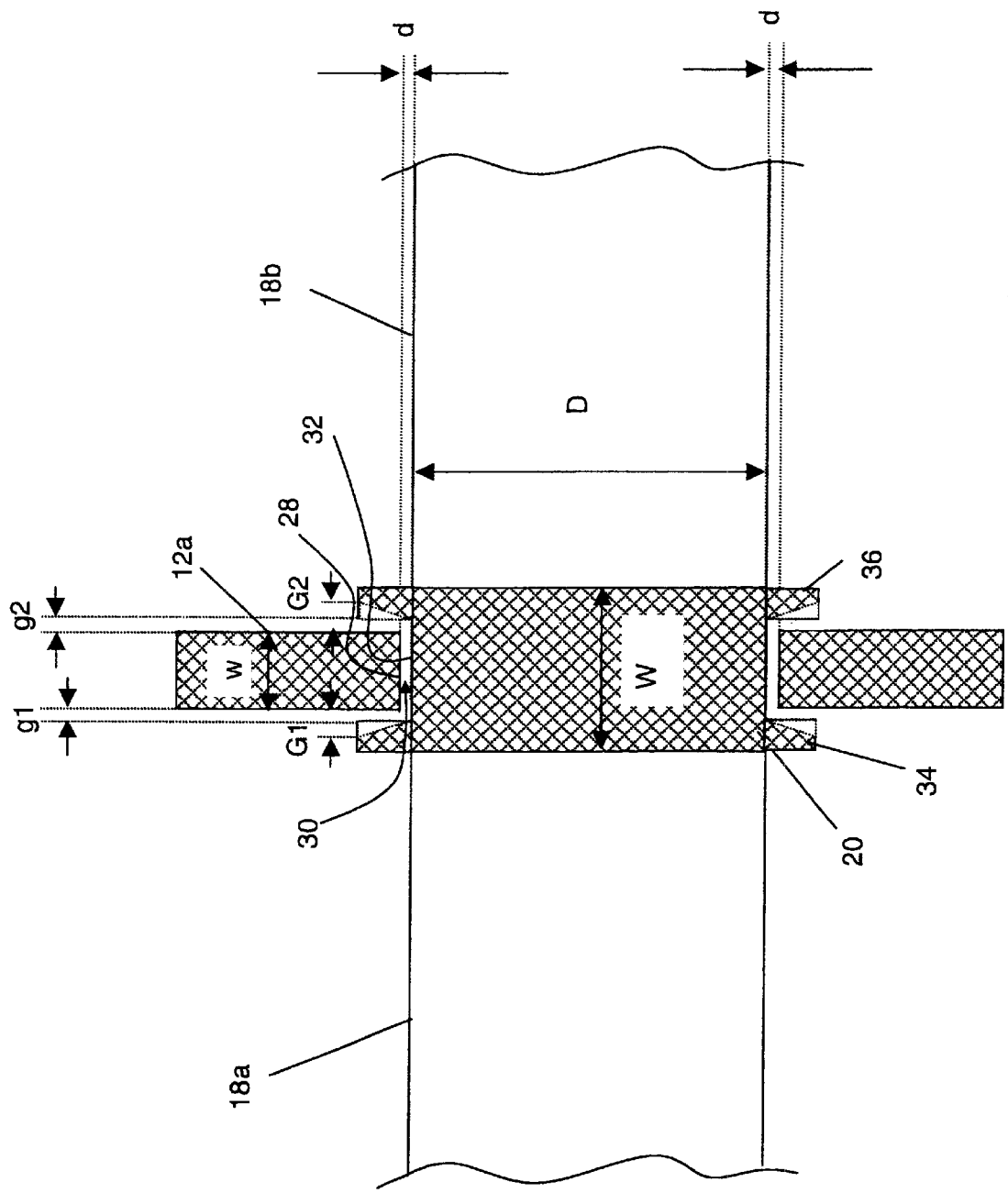
FIG. 6 shows an enlargement of a transmission system of a fifth embodiment of the invention.

A fifth embodiment is shown in FIG. 6 which represents a minor modification to the embodiment shown in FIG. 4A. In this embodiment, flanges 34, 36 are tapered so as to increase the initial width G1, G2 of the boundary region 30 between the edge 32 of the Faraday cage 12 and the conductive surface 28 of the drive shaft 18. Running in from the periphery of the nonconductive region down towards the base of the U-bend or groove the width g1, g2 of the gap narrows, however, the gaps need not be symmetrically provided on either side of the Faraday cage wall 12a. As FIG. 6 shows, G1>g1, and G2>g2 however, G1 need not equal G2 and g1 need not equal g2.

Figure 7:
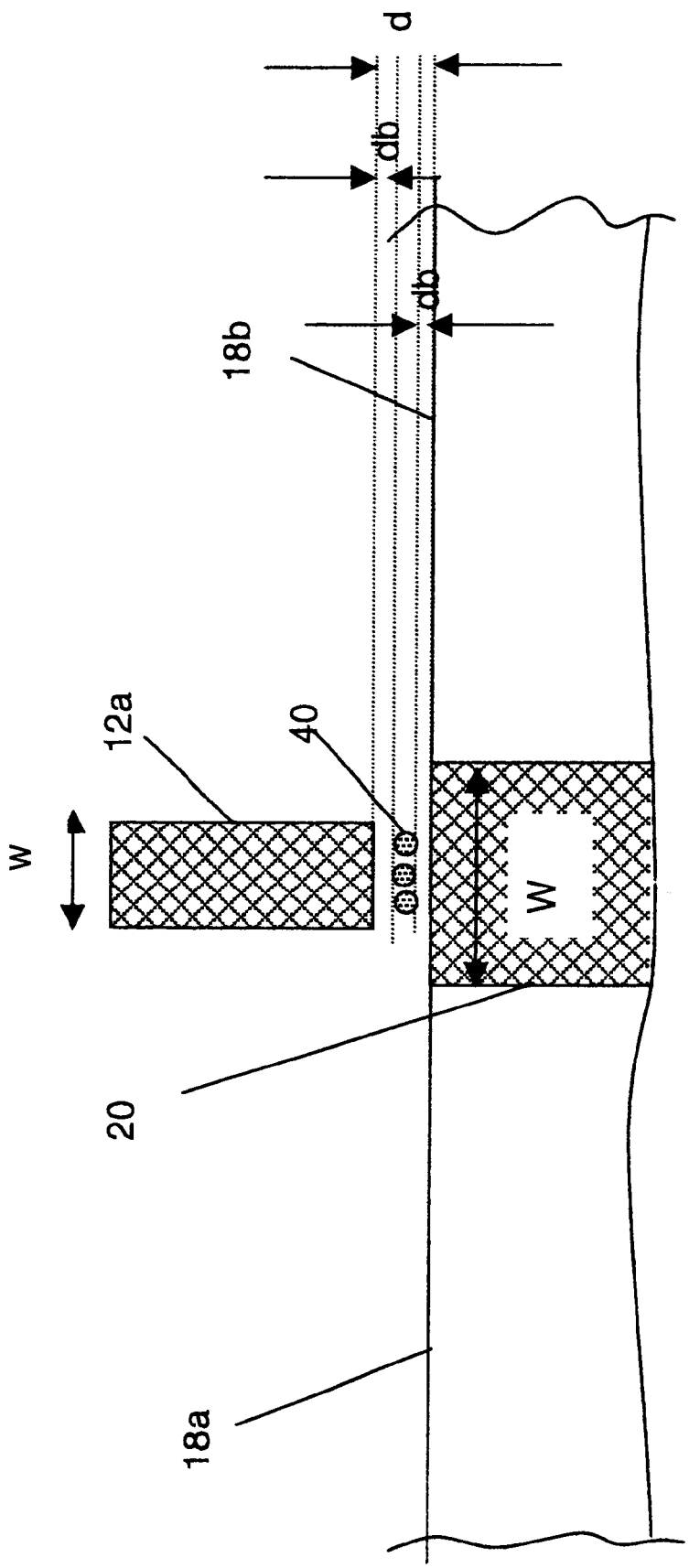
FIG. 7 shows an enlargement of a transmission system of a sixth embodiment of the invention.

Another example of a modification is shown in the sixth embodiment sketched in FIG. 7 where the boundary region 30 is further reduced in size by the provision of conductive ball bearings 40, which may be accompanied as well by a conductive lubricant, for example, graphite. FIG. 7 shows how conductive ball bearings 40 reduce the width of the boundary region 30 from "d" to "db", the gap between the bearings 40 and the edge 28 of the Faraday cage 12 or the surface 32 of the conductive portion of drive shaft 26. Appropriate journaling and means to contain ball bearings 40 (not shown in FIG. 7) can be provided in accordance with techniques well known to the skilled man in the art.

By providing a mechanism to transfer energy along a path which is not electrically conductive, power can be transferred in a form which cannot be affected by EMI. The transmission system apparatus thus enables power to be more safely provided to equipment housed within the Faraday cage 12. Advantageously, the energy is transferred in a form which excludes EMI disturbances which may otherwise permeate the cage interior along conventional power transfer connections such as electrical cabling etc., and damage the equipment housed within the cage. Fibre-optic connections can still be provided to enable communications between the cage interior and exterior without overly compromising the performance of the cage.

The invention equivalently enables electrical power to be provided within a Faraday cage and without compromising the ability of the Faraday cage to retain electromagnetic radiation emanating from equipment housed within the cage. In the case of communications equipment which may otherwise be monitored, the provision of a power source which does not increase the likelihood of the communications activity being monitored is very desirable.

Effectively, the transmission system 18 provides a filter function by enabling power to be generated within the Faraday cage 12 without any potentially damaging disturbance caused by external power fluctuations affecting equipment housed within the cage. The external power source can be a motor or other mechanical, hydraulic or manual means which is able to couple to the transmission system as so provide energy to within the Faraday cage 12.

FIG. 8A illustrates a seventh embodiment of the invention in which the transmission element comprises a drive belt 50 suitably mounted on rollers 52, 54. The size of the drive belt 50 is selected to ensure that the apertures 56, 58 through the wall 12a of the Faraday cage are suitably small. Roller 52 drives the belt 50 which transfers energy through the Faraday cage to drive roller 54. Roller 54 powers equipment (not shown) housed inside the Faraday cage, for example an electrical generator. Drive belt 50 may be constructed from a non-conductive material where appropriate. FIG. 8B shows how an additional, conductive roller elements 60 may be provided in registration with the Faraday cage such that the drive belt itself fills the boundary region 30. Other embodiments may include other conductive rollers 60 in the vicinity of the Faraday cage to remove any line-of sight apertures and to further prevent any static charge building up on the non-conductive belt (see FIG. 8C).

FIGS. 9A and 9B show an eighth embodiment of the invention in which fluid is driven into Faraday cage 12 by a suitably arranged pump 78. Pump 78 drives a fluid along a transmission pipe 18, for example, propellant means 70 such a FIG. 9A shows may be provided within pipe 18 outside Faraday cage 12 to drive fluid through mesh apertures. If the fluid is non-conductive, the apertures in the mesh will form nonconductive regions 30 in the wall of the Faraday cage. If a fluid which is at least partially conductive is used, the walls of the pipe away from the vicinity of the Faraday cage need to be non-conductive. The conductive fluid can then flow freely into the Faraday cage or, if a mesh is still retained within the pipe, the effect of the mesh size on the shielding efficiency of the Faraday cage is reduced. A compromise between the conductivity required of the fluid, its viscosity, and the mesh size can be determined using conventional techniques known to those skilled in the art.

The fluid passing into the Faraday cage is then able to drive a turbine 74 which is able to drive a generator for example to provide power to other electrical equipment housed within the Faraday cage. The fluid can then circulate back outside the Faraday cage such as FIG. 9B shows.

The above embodiments illustrate how the invention is thus able to provide electrical power and communications activity which, in the event that the external power source is interrupted, can be easily restored. Further advantages include that a manual external power source may be connected to the transmission element, for example, an appropriately geared mechanical crank or pump may drive the transmission element (the latter if a hydraulic transmission element is used such as FIGS. 9A and B show). Such embodiments enable power and communications activity within the Faraday cage to be restored and provided without external electrical activity being required.

It will be apparent to the skilled man in the art, that various features of the embodiments shown in the above Figures may be combined with other embodiments either replacing or adding/removing features as is obvious to the sklled man.

In the above embodiments, at least one aperture is provided in a Faraday cage 12 is one which can be perforated. However, it is also possible to provide a connection through non-perforated or sealed Faraday cages which are not perfect conductors. For example, a moving, especially a rotating, magnetic flux linkage may be provided through the cage to drive a power source located within the Faraday cage. Although this may compromise the shielding efficiency of the Faraday cage, such a power supply is advantageous where the Faraday cage is to be sealed against biological, chemical or other forms of contamination.

The transmission element may be connected to other means providing power within the Faraday cage, for example, a transformer or to a battery charging mechanism for charging batteries. The power supplied to the interior of the Faraday cage 12 by the transmission element may therefore be either AC or DC power.

The above description features the best modes of the invention currently contemplated by the inventor, in which the transmission element may comprise a rotational drive shaft or other mechanical power transfer apparatus, for example, a belt drive, or in which a fluid is driven through the cage to drive a turbine, or in which magnetic flux linkage is used.

Such transmission elements require power from external power sources which can be affected by EMI. However, in the event of a power disruption affecting the source of power to the transmission element, the external power can be restored, for example, mains power may be restored or power provided via alternative means, e.g., a battery or a mechanically driven generator. Thus the transmission element of the invention can be configured to receive power from a variety of alternative external power sources should one source become unavailable. For example, in the event that a mains power supply is interrupted and stops driving motor 16, a manual crank mechanism could be provided, or a combustion engine for example a gas/petrol/diesel driven motor used.

The Faraday cage may house other equipment apart from communications equipment, for example, medical apparatus which is sensitive to EMI such a Nuclear Magnetic Resonance apparatus.

Appropriate miniaturised power generators may be provided within the Faraday cage, such as is known the to skilled man in the art, enabling power to be provided at a circuit board level.

What is claimed is:

1. A transmission system for providing power to equipment housed within a Faraday cage, the transmission system comprising:
    a transmission element adapted to transfer energy from a first power source located outside the Faraday cage to a second power source located within the Faraday cage, the transmission element including a conductive region capable of forming conductive contact with said Faraday cage, the second power source for providing said equipment with power, wherein energy is transferred into the Faraday cage along a non-conductive path.

2. A transmission system as claimed in claim 1, wherein said transmission system and said Faraday wall are configured to engage each other.

3. A transmission system as claimed in claim 1, wherein said conductive contact is formed by at least one friction-reducing element provided between the transmission element and a boundary of the Faraday cage, said at least one friction-reducing element taken from the group consisting of:
    a conductive lubricant,
    a conductive ball-bearing,
    graphite, and
    mercury.

4. A transmission system as claimed in claim 1, wherein said transmission element transfers energy in a form taken from the group consisting of:
    mechanical energy,
    rotational energy,
    hydraulic energy,
    magnetic energy.

5. A transmission system as claimed in claim 1, wherein said transmission element drives said second power source using said first power source and is taken from the group consisting of:
    a drive belt;
    a drive shaft;
    a fluid;
    a hydraulic piston;
    a resilient member;
    a spring.

6. A transmission system as claimed in claim 1 wherein said transmission element is configured to pass through an aperture in said Faraday cage.

7. A communications network including at least one Faraday cage for housing communications equipment and shielding electromagnetic radiation, the Faraday cage provided with a power source having:
    a first power source located outside the Faraday cage;
    a second power source located within the Faraday cage for providing power to said communications equipment; and
    a transmission system comprising a transmission element adapted to transfer energy from a first power source located outside the Faraday cage to a second power source located within the Faraday cage, the transmission system including a conductive region adaptive to form conductive contact with said Faraday cage;
    the second power source being for providing said communications equipment with power,
    wherein energy is transferred into the Faraday cage without using a conductive electrical path.

8. A power source for equipment housed in a Faraday cage, the power source including:
    a first power source located outside the Faraday cage;
    a second power source located within the Faraday cage for providing power to said equipment; and
    a transmission system comprising a transmission element adapted to transfer energy from a first power source located outside the Faraday cage to a second power source located within the Faraday cage, the transmission system including a conductive region capable of forming conductive contact with said Faraday cage; the second power source for providing said equipment with power, wherein energy is transferred into the Faraday cage without using a conductive electrical path.

9. A power source as claimed in claim 8 further including a low-pass filter.

10. A power source as claimed in claim 9, wherein said first power source is powered by electrical power.

11. A power system as claimed in claim 9, wherein said first power source is an electric motor.

12. A power source as claimed in claim 9, wherein said second power source comprises an electrical generator which is driven by the energy transferred by said transmission system.

13. A power source as claimed in claim 8 further including a lower pass filter, wherein said low-pass filter filters out any high-energy pulse to power provided to said first power source.

14. A power source as claimed in claim 8, wherein said second power source provides electrical power.

15. A Faraday cage for housing equipment and shielding electromagnetic radiation, the Faraday cage having a power source including:

a first power source located outside the Faraday cage;

a second power source located within the Faraday cage for providing power to said equipment; and a transmission system comprising a transmission element adapted to transfer energy from a first power source located outside the Faraday cage to a second power source located within the Faraday cage, the transmission system including a conductive region capable of forming conductive contact with said Faraday cage; the second power source being for providing said equipment with power, wherein energy is transferred into the Faraday cage without using a conductive electrical path.

16. A Faraday cage as claimed in claim 15, wherein said power source provides electrical power to said equipment, said Faraday cage provides optical means for the ingress to and egress from data from said equipment and said equipment is take from the group consisting of:

communications equipment, computer equipment, medical equipment.

17. A Faraday cage as claimed in claim 15, wherein a wave-guide is attached to said Faraday cage in the vicinity of an aperture through which said transmission element passes, said wave-guide being adapted to prevent further propagation of electromagnetic radiation of a predetermined wavelength away from said aperture in said Faraday cage.

18. A Faraday cage as claimed in claim 15, wherein said Faraday cage provides shielding against EMI disturbance.

* * * * *

UNITED STATES PATENT AND TRADEMARK OFFICE
CERTIFICATE OF CORRECTION

PATENT NO.    : 6,597,255 B1
DATED         : July 22, 2003
INVENTOR(S)   : Brian Turton et al.

It is certified that error appears in the above-identified patent and that said Letters Patent is hereby corrected as shown below:

<u>Title page,</u>
Item [75], should read -- Brian C. Turton, Sully, United Kingdom, Christopher Field, Chepstow Road, United Kingdom --.

Signed and Sealed this

Twenty-fourth Day of February, 2004

JON W. DUDAS
*Acting Director of the United States Patent and Trademark Office*